US011026349B2

(12) United States Patent
Taylor et al.

(10) Patent No.: US 11,026,349 B2
(45) Date of Patent: Jun. 1, 2021

(54) TELECOMMUNICATIONS ENCLOSURE WITH SEPARATE HEAT SINK ASSEMBLY

(71) Applicant: COMMSCOPE TECHNOLOGIES LLC, Hickory, NC (US)

(72) Inventors: Christopher Charles Taylor, Cheltenham (GB); David Patrick Murray, Bristol (GB); David Thomas, Chester (GB)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/614,845

(22) PCT Filed: May 18, 2018

(86) PCT No.: PCT/US2018/033408
§ 371 (c)(1),
(2) Date: Nov. 19, 2019

(87) PCT Pub. No.: WO2018/213717
PCT Pub. Date: Nov. 22, 2018

(65) Prior Publication Data
US 2020/0093034 A1    Mar. 19, 2020

Related U.S. Application Data

(60) Provisional application No. 62/508,505, filed on May 19, 2017.

(51) Int. Cl.
*H05K 7/20* (2006.01)
*G02B 6/42* (2006.01)
(Continued)

(52) U.S. Cl.
CPC ......... *H05K 7/20445* (2013.01); *G02B 6/428* (2013.01); *G02B 6/4269* (2013.01);
(Continued)

(58) Field of Classification Search
None
See application file for complete search history.

(56) References Cited

U.S. PATENT DOCUMENTS 6,065,530 A    5/2000  Austin et al.
7,457,126 B2 * 11/2008 Ahrens ................ G02B 6/4292
                                                           257/E23.088
(Continued)

FOREIGN PATENT DOCUMENTS

JP    2007-188998 A    7/2007

OTHER PUBLICATIONS

International Search Report and Written Opinion of the International Searching Authority for International Patent Application No. PCT/US2018/033408 dated Sep. 12, 2018, 13 pages.
(Continued)

*Primary Examiner* — Courtney L Smith
(74) *Attorney, Agent, or Firm* — Merchant & Gould P.C.

(57) ABSTRACT

Disclosed herein is a telecommunications enclosure. The telecommunications enclosure includes a housing defining an interior and including at least one cable port. The telecommunications enclosure also includes a printed circuit board in the interior of the housing and heat generating components on the printed circuit board. The telecommunications enclosure further includes a heat sink assembly in the interior of the housing. The heat sink assembly includes a thermally conductive plate mounted to transfer heat to the housing; and heat sink components extending from a first face of the thermally conductive plate. Each heat sink component corresponds to and is in alignment with one of the heat generating components. The heat sink assembly is a separate component from the housing.

23 Claims, 8 Drawing Sheets

(51) Int. Cl.
*H05K 1/02* (2006.01)
*H05K 1/18* (2006.01)
*H05K 5/02* (2006.01)
*H05K 5/03* (2006.01)
*H05K 5/04* (2006.01)
*H05K 5/06* (2006.01)

(52) U.S. Cl.
CPC .......... *H05K 1/0203* (2013.01); *H05K 1/181* (2013.01); *H05K 5/0247* (2013.01); *H05K 5/03* (2013.01); *H05K 5/04* (2013.01); *H05K 5/069* (2013.01); *H05K 2201/10409* (2013.01)

(56) References Cited

U.S. PATENT DOCUMENTS

| | | | |
|---|---|---|---|
| 7,855,891 B1 | 12/2010 | Ayres, III et al. | |
| 8,345,445 B2 * | 1/2013 | Del Prete | G06F 1/20 361/804 |
| 8,422,231 B2 * | 4/2013 | Huang | H05K 7/20218 361/709 |
| 8,681,501 B2 * | 3/2014 | Govindasamy | G06F 1/203 361/710 |
| 9,313,925 B2 * | 4/2016 | Kelty | G06F 1/20 |
| 10,681,844 B2 * | 6/2020 | Trygubova | H05K 1/0201 |
| 2006/0082973 A1 * | 4/2006 | Egbert | H05K 7/20154 361/709 |
| 2006/0133049 A1 | 6/2006 | Hagiwara | |
| 2010/0321898 A1 | 12/2010 | Tzeng et al. | |
| 2014/0029217 A1 | 1/2014 | Nishihara et al. | |
| 2014/0160679 A1 * | 6/2014 | Kelty | H05K 7/20672 361/700 |
| 2014/0321061 A1 * | 10/2014 | Moore | H05K 9/0058 361/709 |
| 2014/0321064 A1 | 10/2014 | Bose et al. | |
| 2016/0205762 A1 * | 7/2016 | Ritter | H05K 7/20409 361/720 |
| 2016/0316588 A1 | 10/2016 | Jensen et al. | |
| 2018/0310435 A1 * | 10/2018 | Sharf | H05K 7/20409 |

OTHER PUBLICATIONS

Extended European Search Report for European Patent Application No. 18802892.2 dated Jan. 27, 2021, 8 pages.

* cited by examiner ns enclosure including a heat sink assembly for dissipating heat produced by active or passive electronic components in the telecommunications enclosure.

TELECOMMUNICATIONS ENCLOSURE WITH SEPARATE HEAT SINK ASSEMBLY

CROSS-REFERENCE TO RELATED APPLICATION

This application is a National Stage Application of PCT/US2018/033408, filed on May 18, 2018, which claims the benefit of U.S. Patent Application Ser. No. 62/508,505, filed on May 19, 2017, the disclosures of which are incorporated herein by reference in their entireties.

TECHNICAL FIELD

The present disclosure relates generally to a telecommunications enclosure including a heat sink assembly for dissipating heat produced by active or passive electronic components in the telecommunications enclosure.

BACKGROUND

Telecommunications systems typically employ a network of telecommunications cables capable of transmitting large volumes of data and voice signals over relatively long distances. More recently, these cables have also been used to enable remote powering of electronic devices. The telecommunications cables can include fiber optic cables, electrical cables, or combinations of electrical and fiber optic cables. A typical telecommunications network also includes a plurality of telecommunications enclosures integrated throughout the network of telecommunications cables. The telecommunications enclosures are adapted to house and protect telecommunications components.

Telecommunications enclosures that hold circuitry for transmitting or converting optical signals and electrical signals sometimes generate significant amounts of heat that can negatively affect the operation of the circuits within the enclosure. For example, the heat generated can cause reduced efficiency, reduced lifespan, or other negative effects. Improvements are desired.

SUMMARY

One aspect of the present disclosure relates to a telecommunications enclosure. The telecommunications enclosure comprises a housing defining an interior and including at least one cable port. The telecommunications enclosure also comprises a printed circuit board in the interior of the housing and heat generating components on the printed circuit board. The telecommunications enclosure further comprises a heat sink assembly in the interior of the housing. The heat sink assembly comprises a thermally conductive plate mounted to transfer heat to the housing. The heat sink assembly also comprises heat sink components extending from a first face of the thermally conductive plate. Each heat sink component corresponds to and is in alignment with one of the heat generating components. The heat sink assembly is a separate component from the housing.

Another aspect of the present disclosure relates to a method for making a heat sink assembly. The method comprises positioning a plurality of heat sink components into corresponding first holes in a jig base. The method further comprises press fitting an end of each heat sink component into one of a plurality of holes in the thermally conductive plate.

DETAILED DESCRIPTION

Figure 1:
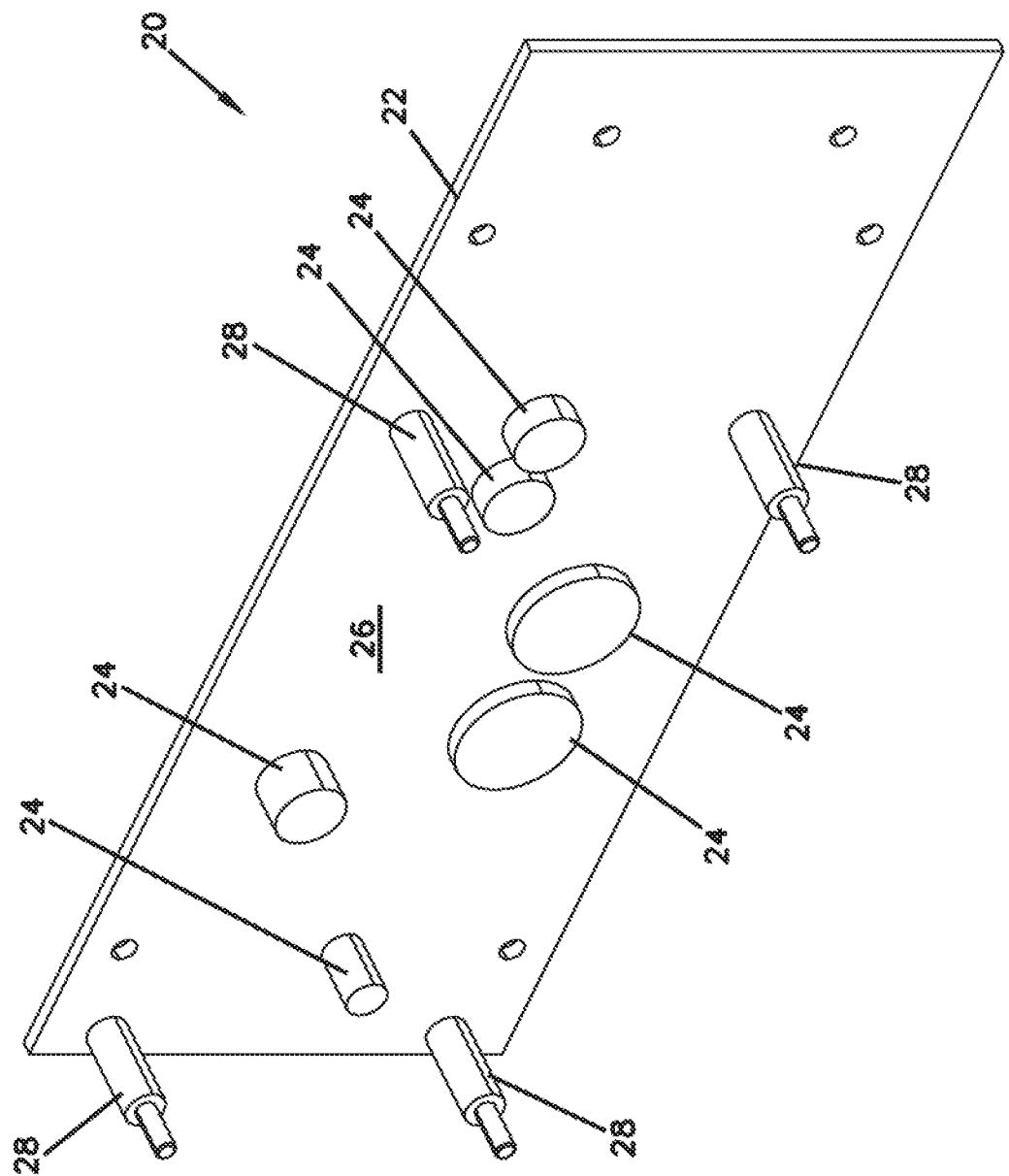
FIG. 1 is a perspective view of an embodiment of a heat sink assembly.

Aspects of the present disclosure relate to a telecommunications enclosure including a housing and a heat sink assembly that is a separate component from the housing. The telecommunications enclosure is more easily manufactured compared to a telecommunications enclosure having a heat sink incorporated into the housing. Existing telecommunications enclosures include a heat sink die cast into a housing. If the layout of a printed circuit board is changed, a new heat sink would need to be die cast with the housing. Die casting also requires upfront tooling costs. In contrast, the heat sink assembly disclosed herein can be modified without modifying the housing and can also be modified with relatively low cost. Additionally, the heat sink assembly disclosed herein can be manufactured with relatively low upfront cost.

In some embodiments, the heat sink assembly is manufactured by press fitting heat sink components into holes in a thermally conductive plate. Manufacture by press fitting is particularly easy and efficient. In other embodiments, the heat sink assembly is manufactured by attaching heat sink components to the thermally conductive plate through an integrated threaded interface. In yet other embodiments, the heat sink assembly is manufactured by attaching heat sink components to the thermally conductive plate with separate threaded fasteners.

Further aspects of the present diclosure relate to a method for manufacturing a heat sink assembly. This method utilizes a jig base to position heat sink components and mounting posts, if desired, of the heat sink assembly for press fitting into holes in a thermally conductive plate of the heat sink assembly. The method can be used to simultaneously press fit the heat sink components and mounting posts (if present) into holes in the thermally conductive plate. An arrangment of holes in the thermally conductive plate can be pre-made and certain holes selected for use during assembly of the heat sink components and mounting posts on the thermally conductive plate. Alternatively, an arrangement of holes in the thermally conductive plate can be customized at the time of assembly of the heat sink components and mounting posts on the thermally condutive plate.

Aspects of the present disclosure also relate to a telecommunications enclosure having a heat sink assembly that is customizable to different arrangements of heat generating components in the telecommunications enclosure. Embodiments of the heat sink assembly disclosed herein include a thermally conductive plate with various holes for receiving heat sink components and, in some cases, mounting posts. Depending on the number and pattern of holes in the thermally conductive plate, when manufacturing the heat sink assembly, the heat sink assembly can be customized with a particular configuration and number of heat sink components and a particular configuration and number of mounting posts.

In the following detailed description, reference is made to the accompanying drawings showing by way of illustration specific embodiments of the telecommunications enclosure and method disclosed herein. It is to be understood that other embodiments may be utilized and structural or logical changes may be made without departing from the scope of the present disclosure. The following detailed description, therefore, is not to be taken in a limiting sense.

Figure 2:
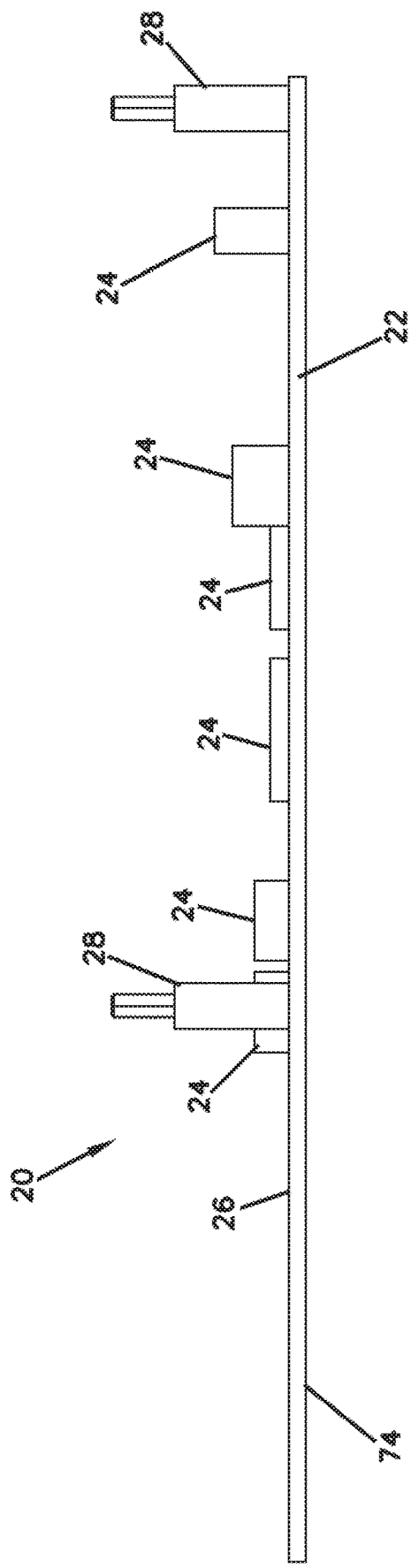
FIG. 2 is a side view of the heat sink assembly of FIG. 1.

FIGS. 1 and 2 illustrate an embodiment of a heat sink assembly 20 adapted to be incorporated into a telecommunications enclosure as disclosed herein. The heat sink assembly 20 includes a thermally conductive plate 22 as well as heat sink components 24 extending from a first face 26 of the thermally conductive plate 22. As illustrated in FIG. 1, the heat sink assembly also includes a plurality of mounting posts 28 extending from the first face 26 of the thermally conductive plate 22.

The heat sink assembly 20 may be manufactured in a variety of ways. However, the heat sink assembly 20 is advantageously manufactured by press fitting protrusions on the heat sink components 24 and mounting posts 28 (or, alternatively, ends of the heat sink components 24 and mounting posts 28) into corresponding holes in the thermally conductive plate 22. Alternatively, the heat sink assembly can be die cast.

Figure 8:
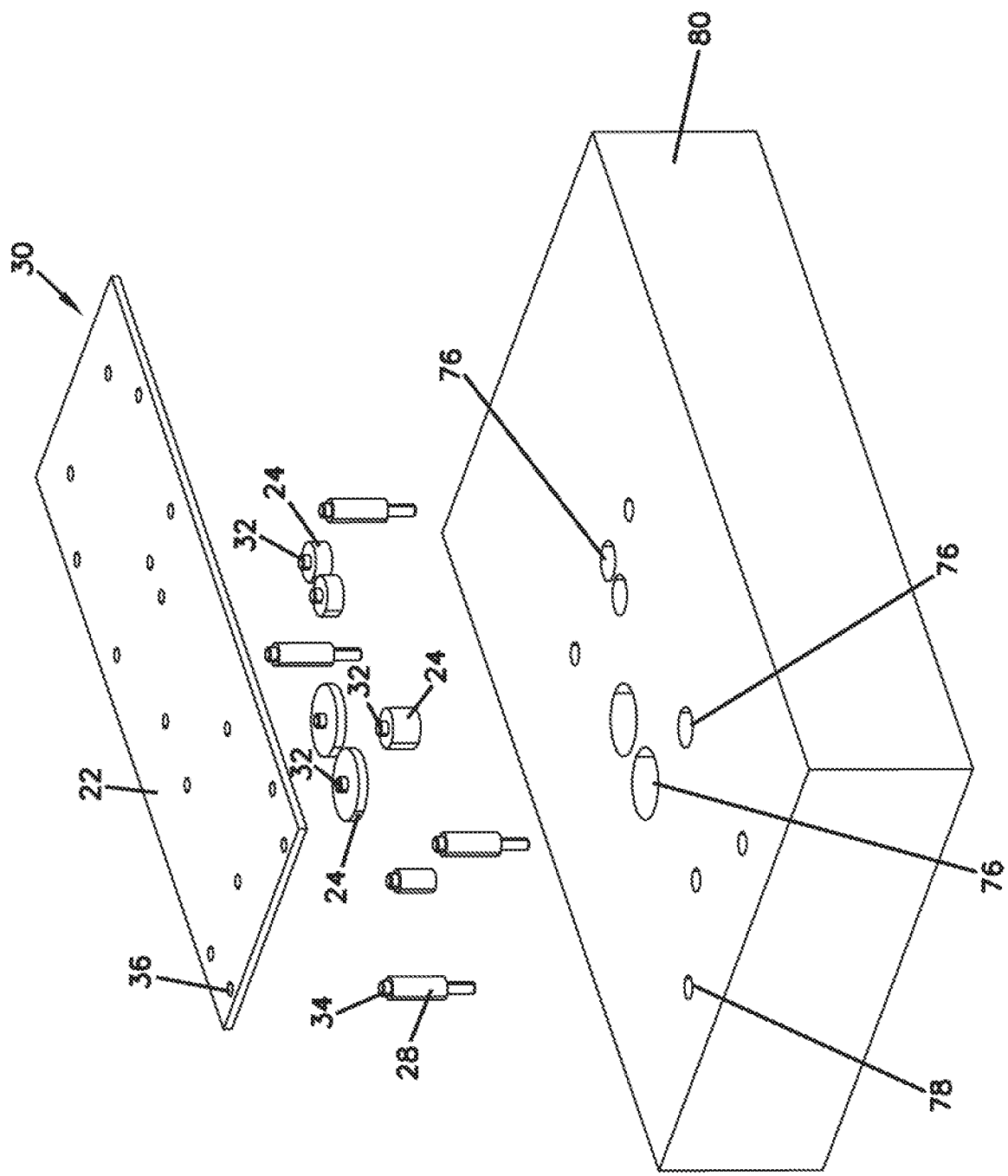
FIG. 8 is an exploded view showing a jig base prior to placement of heat sink components and mounting posts of a heat sink assembly into corresponding holes in the jig base, and also showing a thermally conductive plate of the heat sink assembly prior to a press fitting step.

An embodiment of the heat sink assembly 30 where the heat sink assembly is manufactured by press fitting is illustrated with reference to FIGS. 8 and 9. FIG. 8 shows first protrusions 32 on the heat sink components 24 and second protrusions 34 on the mounting posts 28. FIG. 8 also shows corrresponding holes 36 in the thermally conductive plate 22 into which the first and second protrusions 32, 34 are press fit. FIG. 8 shows the holes 36 extending through the entire height of the plate 22 (i.e., the holes are through-holes). However, it should be appreciated that the holes need not extend through the entire height of the plate. It should also be appreciated that the heat sink components 24 and the mounting posts 28 need not include protrusions 32, 34 for press fitting into the holes 36. Instead, ends of the heat sink components 24 and mounting posts 28 can be press fit into holes 36. Manufacture of the heat sink assembly 30 by press fitting is quick and inexpensive because there is relatively low upfront cost. For example, tooling for die casting is not necessary.

In an embodiment, the thermally conductive plate comprises a plurality of through-holes; the heat sink components each comprise a protrusion; and the protrusions of the heat sink components are press fit into the thermally conductive plate. In an embodiment, the thermally conductive plate comprises a plurality of through-holes; the heat sink components and the mounting posts each comprise a protrusion; and the protrusions of the heat sink components and the mounting posts are press fit into the thermally conductive plate.

Alternatively, turning back to FIGS. 1 and 2, instead of press fitting, the heat sink components 24 and mounting posts 28 can be fastened to the thermally conductive plate 22 by an integrated threaded interface. For example, first protrusions 32 on the heat sink components 24 and holes 36 can form the integrated threaded interface. Second protrusions 34 on the mounting posts 28 and holes 36 can also form the integrated threaded interface. Altheratively, separate threaded fasteners (e.g., screws) (not shown) may be used to fasten the heat sink components 24 and mounting posts 28 to the thermally conductive plate 22. While not as efficient as press fitting, attaching the heat sink components 24 and mounting posts 28 to the thermally conductive plate 22 by an integrated threaded interface or separate threaded fasteners still requires relatively low upfront cost, for example, as compared to die casting.

In an embodiment, the heat sink components are attached to the thermally conductive plate through an integrated threaded interface. In an embodiment, the heat sink components and the mounting posts are attached to the thermally conductive plate through an integrated threaded interface.

In an embodiment, the thermally conductive plate comprises a plurality of threaded through-holes; and the heat sink components are attached to the thermally conductive plate with threaded fasteners. In an embodiment, the thermally conductive plate comprises a plurality of threaded through-holes; and the heat sink components and mounting posts are attached to the thermally conductive plate with threaded fasteners.

Figure 5:
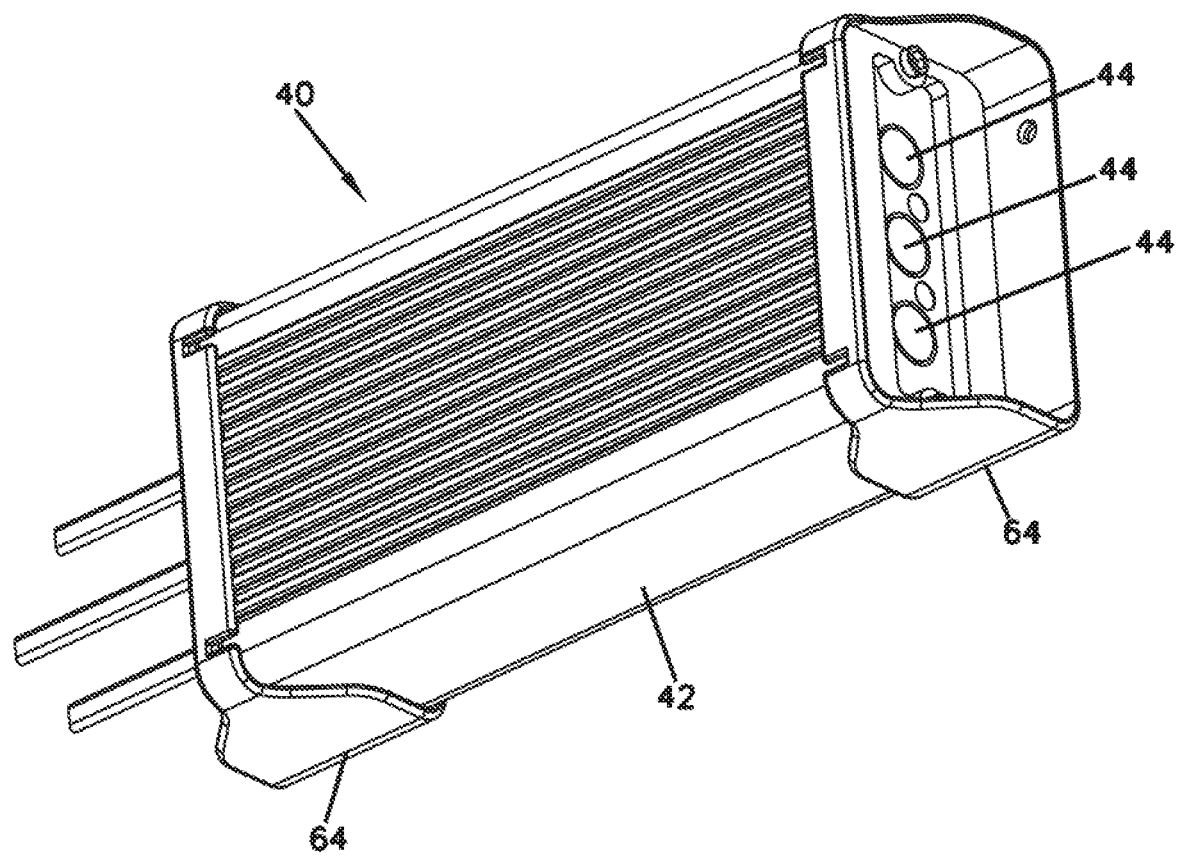
FIG. 5 shows an embodiment of a telecommunications enclosure.
Figure 6:
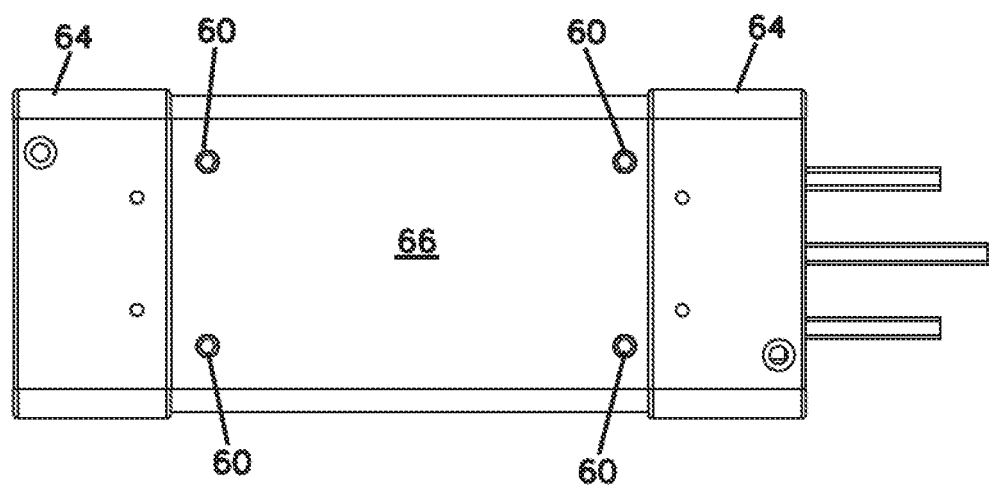
FIG. 6 shows a bottom view of the telecommunications enclosure of FIG. 5.

FIGS. 5 and 6 illustrate an embodiment of a telecommunications enclosure 40 as disclosed herein. The telecommunications enclosure 40 comprises a housing 42 that defines an interior and includes at least one cable port 44. The cable port(s) can pass through any portion of the housing 42. In the embodiment depicted in FIGS. 5 and 6, three cable ports 44 pass through an end of the housing 42. Various cable ports can be provided for incoming and outgoing cables, including fiber optic cables. The housing 42 is preferably sealed from an external environment. The telecommunications enclosure 40 includes a printed circuit board in the interior of the housing 42 as well as the heat sink assembly in the interior of the housing 42.

Figure 3:
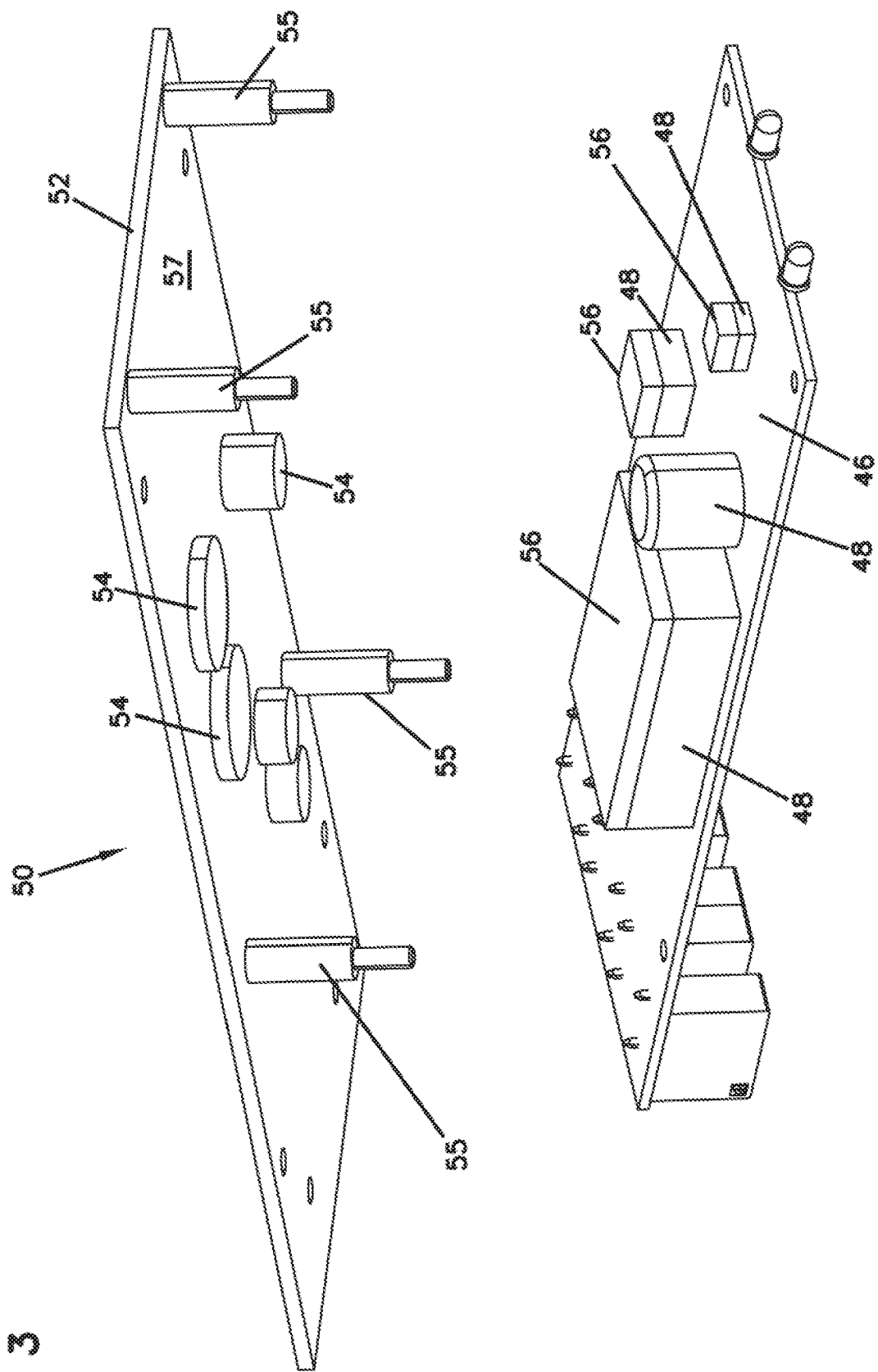
FIG. 3 shows another embodiment of a heat sink assembly in conjunction with an exemplary printed circuit board.
Figure 4:
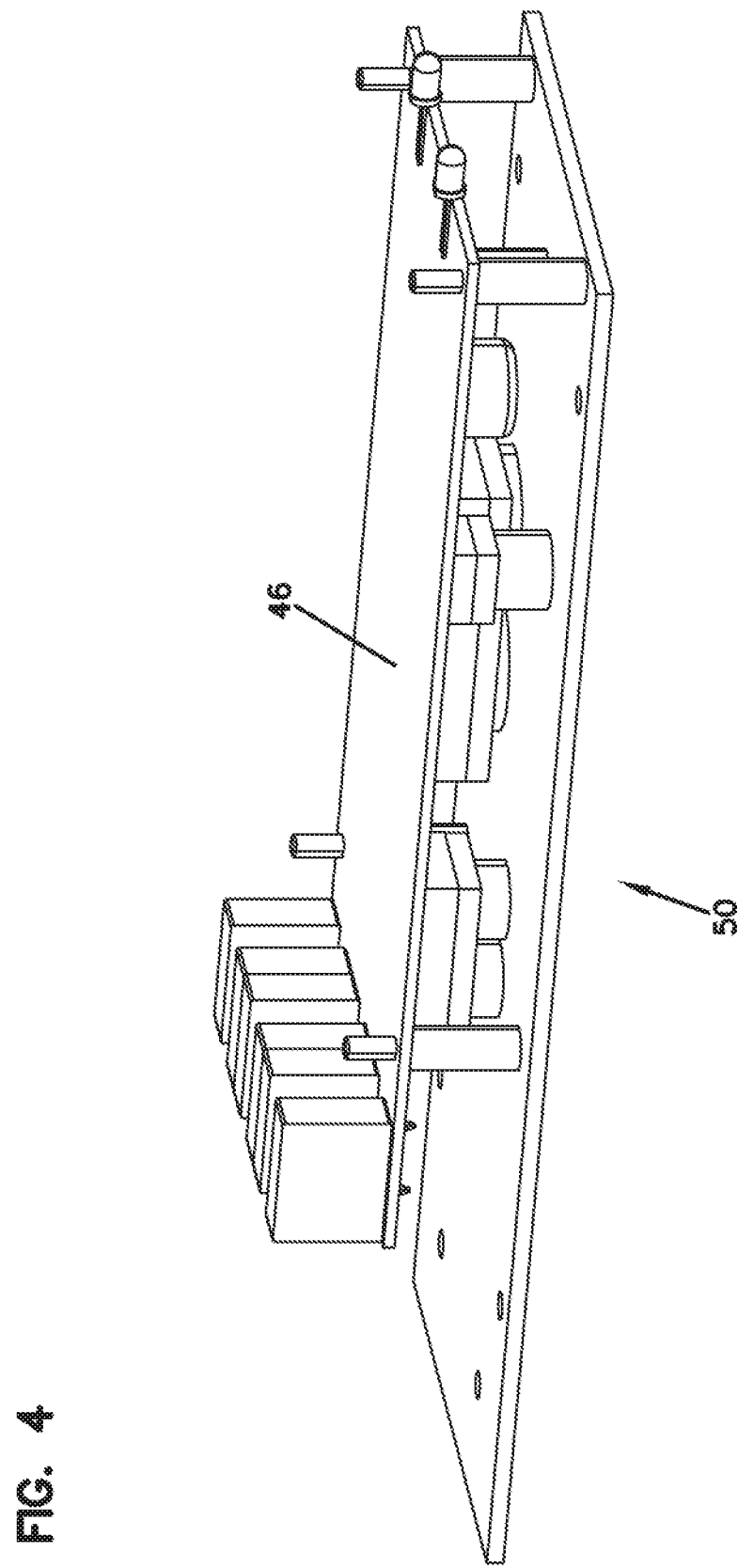
FIG. 4 shows the printed circuit board of FIG. 3 mounted on the heat sink assembly of FIG. 3.

Heat generating components are on the printed circuit board. An exemplary printed circuit board 46 having heat generating components 48 thereon is depicted in FIGS. 3 and 4. As used herein, the term "heat generating component" refers to any type of active or passive electronic component that produces heat during normal operation. For example, heat generating components include any devices or circuitry involved in the conversion of optical signals to electric signals or vice versa, including but not limited to high speed data processing integrated circuits, power switching transistors, inductors, and DC-DC converters. Accordingly, the telecommunications enclosure 40 can house active or passive electronic circuitry related to fiber optic signal transmission or conversion.

An exemplary heat sink assembly 50 is also depicted in FIGS. 3 and 4. As with heat sink assembly 20, heat sink assembly 50 includes a thermally conductive plate 52 and heat sink components 54 extending from a first face 57 of the thermally conductive plate 52. The thermally conductive plate 52 is mounted to transfer heat to the housing 42. As shown in FIGS. 3 and 4, each heat sink component 54 corresponds to and is in alignment with one of the heat generating components 48. The heat sink assembly 50 is a separate component from the housing 42. The exemplary heat sink assembly 50 depicted in FIGS. 3 and 4 also includes mounting posts 55 extending from the first face 57 of the thermally conductive plate 52. The mounting posts 55 are attached to the printed circuit board 46 (see FIG. 4). FIGS. 3 and 4 depict four mounting posts 55 extending from the first face 57 of the thermally conductive plate 52.

However, it should be appreciated that the number and placement of the mounting posts 55 may be varied.

If desired, a heat pad 56 may be disposed between each heat generating component 48 and each heat sink component 54 such that each heat pad 56 is in contact with the heat generating component 48 and the heat sink component 54. As used herein, the term "heat pad" refers to any thermally conductive pad that provides a thermal path between a heat generating component and a heat sink component. A heat pad can be deformable to help maintain contact between a heat generating component and a heat sink component. Heat pads are known in the art.

During operation, heat generated by the heat generating components 48 is transferred to heat sink components 54 either directly or through heat pads 56. Heat is then transferred from heat sink components 54 to the thermally conductive plate 52 and subsequently to the housing 42. Finally, heat is transferred from the housing 42 to the external environment. In this manner, the telecommunications enclosure 40 dissipates heat from the heat generating components 48 to the external environment. This heat dissipation ensures that the generated heat does not negatively affect the function of the electrical circuitry within the housing 42.

The thermally conductive plate 52 may be mounted in any fashion to transfer heat to the housing 42. For example, the thermally conductive plate 52 can be mounted adjacent to and preferably in contact with the housing. As an example, parallel guides 58 (see FIG. 7) can receive the thermally conductive plate 52 and retain the thermally conductive plate 52 adjacent to the housing 42. As another example, the thermally conductive plate 52 can be attached to the housing 42 with one or more threaded fasteners 60 (e.g., screws) (see FIG. 6). Alternatively, the thermally conductive plate 52 can be mounted with both the parallel guides and one or more threaded fasteners.

In order for heat to transfer effectively from the heat generating components to the heat sink components to the thermally conductive plate and subsequently to the housing and the external environment, each of the heat sink components, the thermally conductive plate, and the housing has a construction that includes a thermally conductive material (e.g., metal). In one embodiment, the housing has a construction that includes metal or a combination of metal and a plastic (e.g., polypropylene). Similarly, in an embodiment, the heat sink components have a construction that includes metal. Likewise, in an embodiment, the thermally conductive plate has a construction that includes metal. In an embodiment, the metal has a composition that includes aluminum. For example, the metal can be an aluminum alloy. In an embodiment, each of the heat sink components, the thermally conductive plate, and the housing are made of metal having a composition that includes aluminum. The housing can be die cast. Alternatively, the housing can be a metal extrusion having a composition that includes aluminum.

Figure 7:
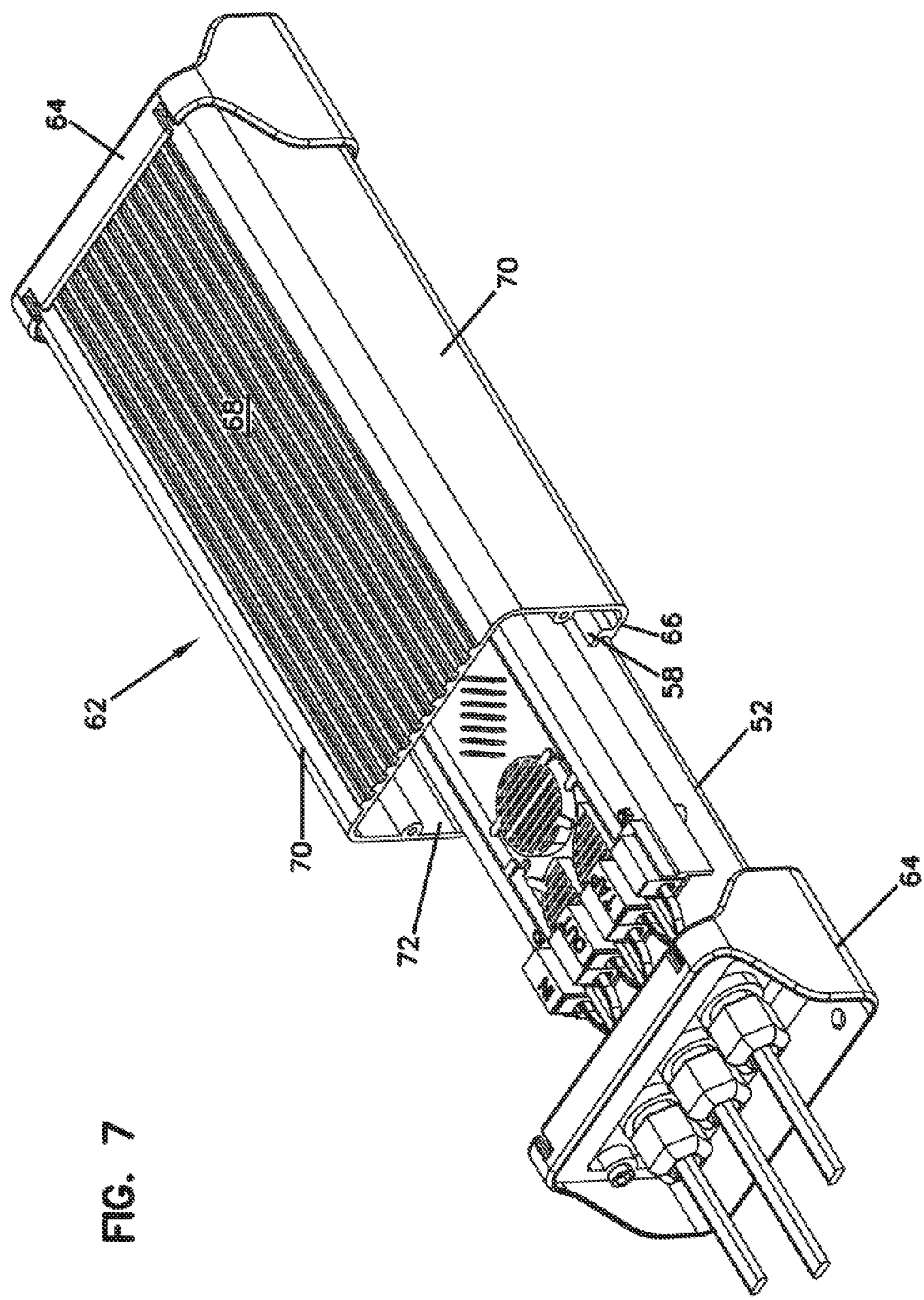
FIG. 7 shows parallel guides for receiving and retaining a heat sink assembly.

In an embodiment, the housing has a structure as depicted in FIGS. 5-7. In particular, in this embodiment, the housing includes a cover 62 and end caps 64. The cover 62 has a bottom side 66, a top side 68 opposite and spaced apart from the bottom side 66, two opposing sides 70 extending between the bottom side 66 and the top side 68, and two opposing openings 72. The end caps 64 cover the two opposing openings 72. In this embodiment, a second face 74 (see FIG. 2) of the thermally conductive plate can be in contact with the bottom side 66 of the cover 62. The end caps 64 can be molded plastic. The cover 62 can be made of metal.

In the embodiment in which the housing includes a cover 62 and end caps 64, heat can be transferred from the heat generating components to the heat sink components to the thermally conductive plate and then to the cover and the external environment. Therefore, the cover can have a construction that includes a thermally conductive material (e.g., metal). In one embodiment, the cover has a construction that includes metal. The metal can have a composition that includes aluminum. For example, the aluminum can be an aluminum alloy.

The mounting posts may or may not be thermally conductive. However, in an embodiment, the mounting posts have a construction that includes metal (e.g., a metal having a composition that includes aluminum), a plastic (e.g., polypropylene), or a combination thereof. In an embodiment, the mounting posts are made of a metal having a composition that includes aluminum.

Turning back to FIGS. 8 and 9, these figures illustrate a method for making a heat sink assembly as disclosed herein. The method involves positioning a plurality of heat sink components 24 into corresponding first holes 76 in a jig base 80; and press fitting an end of each heat sink component 24 into one of a plurality of holes 36 in the thermally conductive plate 22. If mounting posts 28 are desired, the method also involves positioning a plurality of mounting posts into corresponding second holes in a jig base; and press fitting an end of each mounting post into one of the plurality of holes in the thermally conductive plate.

Figure 9:
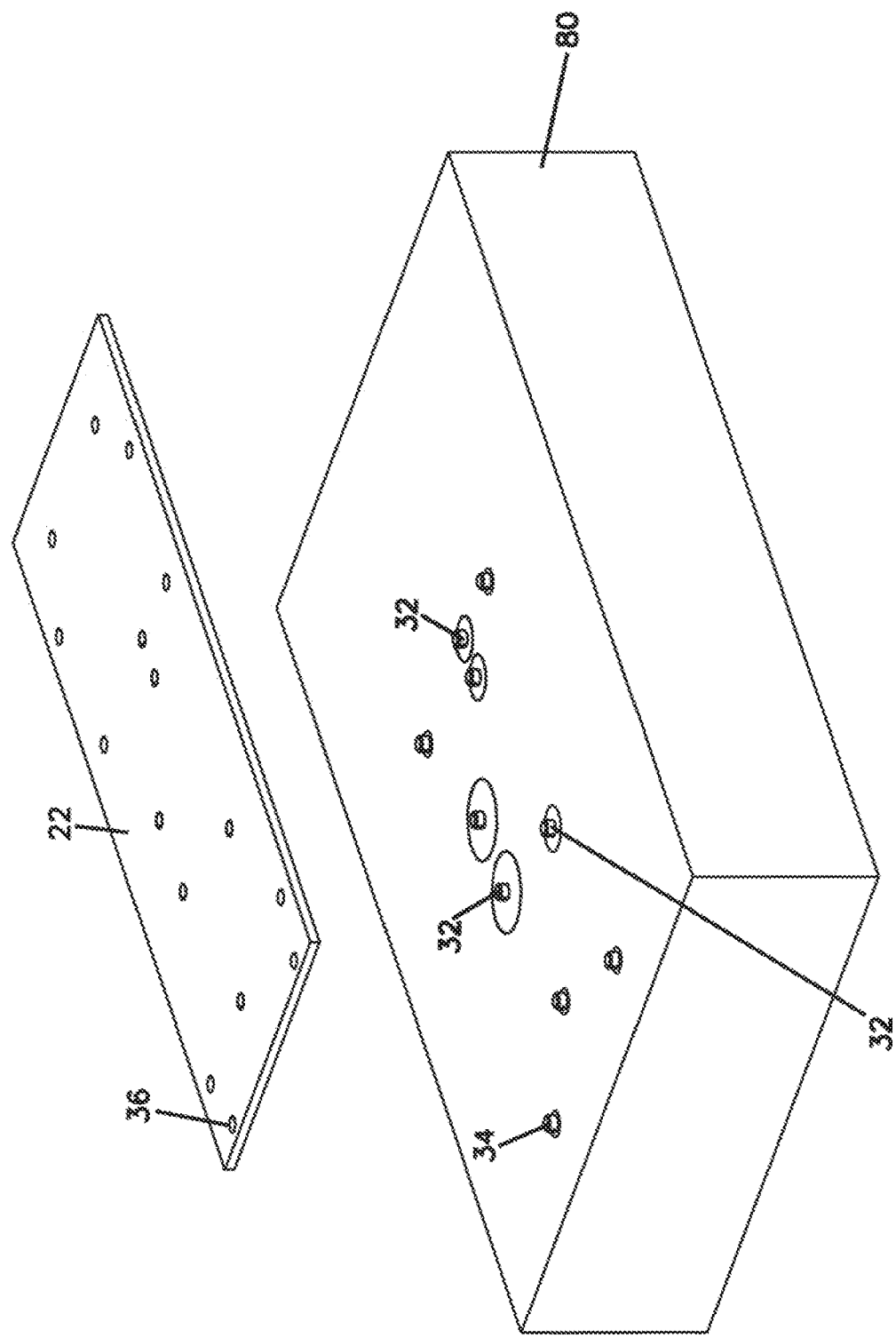
FIG. 9 shows the heat sink components and mounting posts of the heat sink assembly positioned in the jig base and the thermally conductive plate in position for a press fitting step.

In an embodiment, as shown in FIGS. 8 and 9, the end of each heat sink component 24 comprises a first protrusion 32 corresponding to one of the plurality of holes 36 in the thermally conductive plate 22, and the press fitting step comprises press fitting the first protrusions 32 into the holes 36 in the thermally conductive plate 22. Similarly, the end of each mounting post 28 can comprise a second protrusion 34 corresponding to one of the plurality of holes 36 in the thermally conductive plate 22, and the press fitting step can comprise press fitting the second protrusions 34 into the holes 36 in the thermally conductive plate 22.

In an embodiment, the ends of the heat sink components 34 are press fitted into the holes 36 simultaneously, for example, via a press plate (not shown). In an embodiment, first protrusions 32 of the heat sink components 34 can be press fitted into the holes 36 simultaneously.

Similarly, in an embodiment, the ends of the mounting posts 28 are press fitted into the holes 36 simultaneously with press fitting the ends of the heat sink components 24 into the holes 36, for example, via a press plate (not shown). In an embodiment, second protrusions 34 of the mounting posts 28 can be press fitted into the holes 36 simultaneously with press fitting the first protrusions 32 of the heat sink components 24 into the holes 36.

From the foregoing detailed description, it will be evident that modifications and variations can be made without departing from the spirit or scope of the disclosure.

For example, the heat sink components can have any of a variety of shapes, such as a circular shape or a hexagonal shape. A hexagonal shape can be useful for attaching a heat sink component to the thermally conductive plate through an integrated threaded interface.

For example, the features described herein are not limited to a telecommunications enclosure and are generally applicable for dissipating heat from an enclosure in general. Enclosures, for example, in the computer industry, house electronic components that produce heat during normal operation. It is necessary to dissipate this heat to ensure proper functioning of the electronic components within the enclosure. As another example, the features described herein are applicable to enclosures for dedicated power distribution systems and enclosures for control and instrumentation.

An exemplary electronics enclosure includes a housing defining an interior; heat generating components in the interior of the housing; and a heat sink assembly in the interior of the housing. The heat sink assembly includes a thermally conductive plate mounted to transfer heat to the housing. The heat sink assembly also includes heat sink components extending from a first face of the thermally conductive plate. Each heat sink component corresponds to and is in alignment with one of the heat generating components. The heat sink assembly is a separate component from the housing.

REFERENCE LETTERS/NUMBERS heat sink assembly 20
thermally conductive plate 22
heat sink component 24
first face 26
mounting post 28
heat sink assembly 30
first protrusion 32
second protrusion 34
holes 36
telecommunications enclosure 40
housing 42
cable port 44
printed circuit board 46
heat generating component 48
heat sink assembly 50
thermally conductive plate 52
heat sink component 54
mounting post 55
heat pad 56
first face 57
guide 58
threaded fastener 60
cover 62
end caps 64
bottom side 66
top side 68
opposing side 70
opposing opening 72
second face 74
first hole 76
second hole 78
jig base 80

What is claimed is:

1. A telecommunications enclosure, comprising:
a housing defining an interior and including at least one cable port, wherein the housing comprises a cover and end caps, the cover comprising a bottom side, a top side opposite and spaced apart from the bottom side, two opposing sides extending between the bottom side and the top side, and two opposing openings, the end caps covering the two opposing openings, and wherein a second face of the thermally conductive plate is in contact with the bottom side of the cover;
a printed circuit board in the interior of the housing;
heat generating components on the printed circuit board; and
a heat sink assembly in the interior of the housing, the heat sink assembly comprising:
a thermally conductive plate mounted to transfer heat to the housing; and
heat sink components extending from a first face of the thermally conductive plate, each heat sink component corresponding to and being in alignment with one of the heat generating components,
wherein the heat sink assembly is a separate component from the housing.

2. The telecommunications enclosure of claim 1, wherein the thermally conductive plate is in contact with the housing.

3. The telecommunications enclosure of claim 1, wherein a heat pad is located between each heat generating component and each heat sink component and is in contact with the heat generating component and the heat sink component.

4. The telecommunications enclosure of claim 1, wherein the housing is sealed from an external environment.

5. The telecommunications enclosure of claim 1, wherein the housing has a construction that includes metal.

6. The telecommunications enclosure of claim 5, wherein the metal has a composition that includes aluminum.

7. The telecommunications enclosure of claim 1, wherein the cover has a construction that includes metal.

8. The telecommunications enclosure of claim 7, wherein the metal has a composition that includes aluminum.

9. The telecommunications enclosure of claim 1, wherein parallel guides receive the thermally conductive plate and retain the thermally conductive plate adjacent to the housing.

10. The telecommunications enclosure of claim 1, wherein the thermally conductive plate is attached to the housing with a threaded fastener.

11. The telecommunications enclosure of claim 1, wherein the heat sink assembly further comprises mounting posts extending from the first face of the thermally conductive plate and the mounting posts are attached to the printed circuit board.

12. The telecommunications enclosure of claim 1, wherein the heat sink components have a construction that includes metal.

13. The telecommunications enclosure of claim 12, wherein the metal has a composition that includes aluminum.

14. The telecommunications enclosure of claim 1, wherein the thermally conductive plate has a construction that includes metal.

15. The telecommunications enclosure of claim 14, wherein the metal has a composition that includes aluminum.

16. The telecommunications enclosure of claim 1, wherein the thermally conductive plate comprises a plurality of through-holes; the heat sink components each comprise a protrusion; and the protrusions of the heat sink components are press fit into the thermally conductive plate.

17. The telecommunications enclosure of claim 1, wherein the heat sink components are attached to the thermally conductive plate through an integrated threaded interface.

18. The telecommunications enclosure of claim 11, wherein the thermally conductive plate comprises a plurality of through-holes; the heat sink components and the mounting posts each comprise a protrusion; and the protrusions of the heat sink components and the mounting posts are press fit into the thermally conductive plate.

19. The telecommunications enclosure of claim 11, wherein the heat sink components and the mounting posts are attached to the thermally conductive plate through an integrated threaded interface.

20. The telecommunications enclosure of claim 1, wherein the heat sink assembly is die cast.

21. The telecommunications enclosure of claim 1, wherein the housing is die cast.

22. The telecommunications enclosure of clam 1, wherein the housing is a metal extrusion having a composition that includes aluminum.

23. An electronics enclosure, comprising:
- a housing defining an interior and including at least one cable port, wherein the housing comprises a cover and end caps, the cover comprising a bottom side, a top side opposite and spaced apart from the bottom side, two opposing sides extending between the bottom side and the top side, and two opposing openings, the end caps covering the two opposing openings, and wherein a second face of the thermally conductive plate is in contact with the bottom side of the cover;
- heat generating components in the interior of the housing; and
- a heat sink assembly in the interior of the housing, the heat sink assembly comprising:
  - a thermally conductive plate mounted to transfer heat to the housing; and
  - heat sink components extending from a first face of the thermally conductive plate, each heat sink component corresponding to and being in alignment with one of the heat generating components,
- wherein the heat sink assembly is a separate component from the housing.

* * * * *